United States Patent [19]
Bernhardt et al.

[11] Patent Number: 5,583,355
[45] Date of Patent: Dec. 10, 1996

[54] SELF-ALIGNED FET HAVING ETCHED OHMIC CONTACTS

[75] Inventors: Bruce A. Bernhardt, Tempe; Jaeshin Cho, Gilbert; Gregory L. Hansell, Tempe; Schyi-Yi Wu, Mesa, all of Ariz.

[73] Assignee: Motorola, Inc., Schaumburg, Ill.

[21] Appl. No.: 571,632

[22] Filed: Dec. 13, 1995

Related U.S. Application Data

[60] Continuation of Ser. No. 333,821, Nov. 3, 1994, abandoned, which is a division of Ser. No. 902,245, Jun. 22, 1992, Pat. No. 5,389,564.

[51] Int. Cl.$^6$ .................. H01L 31/0328; H01L 29/80; H01L 27/088; H01L 23/48
[52] U.S. Cl. ................ 257/280; 257/192; 257/900; 257/768
[58] Field of Search ..................... 257/744, 745, 257/743, 192, 194, 763, 764, 768, 769, 770, 900, 280, 281, 282, 283, 284, 382

[56] References Cited

U.S. PATENT DOCUMENTS 5,166,096  11/1992  Cote et al. ........................ 257/900

FOREIGN PATENT DOCUMENTS

| 0377126 | 7/1990 | European Pat. Off. | 257/745 |
| 62-143461 | 6/1987 | Japan | 257/745 |
| 62-190768 | 8/1987 | Japan | 257/280 |

*Primary Examiner*—Wael Fahmy
*Attorney, Agent, or Firm*—Bruce T. Neel

[57] ABSTRACT

A III–V semiconductor FET (10, 30, 40) having etched ohmic contacts (19, 20, 36, 37, 43, 44). A gate (16) of the FET (10, 30, 40) is formed in contact with a surface of a III–V substrate (11). An ohmic contact (19, 20, 36, 37, 43, 44) is created to include an alloy in contact with the surface of the substrate (11). The ohmic contact (19, 20, 36, 37, 43, 44) is formed to abut the gate structure (16, 17, 18) by covering a portion of the gate structure (16, 17, 18) and the substrate (11) with the ohmic contact (19, 20, 36, 37, 43, 44), then, removing portions of the ohmic contact from the gate structure (16, 17, 18) by etching. The ohmic contact (19, 20, 36, 37, 43, 44) is formed to be substantially devoid of gold.

5 Claims, 4 Drawing Sheets

5,583,355

SELF-ALIGNED FET HAVING ETCHED OHMIC CONTACTS

This application is a continuation of prior application Ser. No. 08/333,821, filed Nov. 3, 1994, now abandoned which is a divisional application of prior application Ser. No. 07/902,245, filed on Jun. 22, 1992 U.S. Pat. No. 5,389,564.

This application is related to co-pending application "Method Of Forming An Etched Ohmic Contact", attorney docket number SC07849P, filed by Jaeshin Cho concurrently with the present application.

BACKGROUND OF THE INVENTION

The present invention relates, in general, to semiconductor devices, and more particularly, to a novel III–V field effect transistor.

In the past, the semiconductor industry has utilized a variety of methods to form ohmic contacts to III–V field effect transistors (FETs). One common method employs a lift-off technique to create a multi-layer metal contact. Lift-off techniques generally involve blanket metal depositions to a patterned photoresist layer. The multi-layer metal structure is formed through openings in the photoresist. The photoresist openings have sloping sidewalls to permit the photoresist to be dissolved in a solvent in order to remove portions of the metal. The sidewall slope must be very accurately controlled. This sidewall control requirement results in low process yields and corresponding high manufacturing costs.

In addition, these prior lift-off techniques have a minimum spacing between the transistor's gate, and the source and drain ohmic contacts that limits the minimum transistor size that can be obtained. Generally, a minimum gate to ohmic contact spacing of about one micron or greater is required to allow room for the photoresist layer. This minimum gate to ohmic contact spacing, and a minimum lift-off opening of about two microns limits the minimum transistor size to approximately seven to eight microns. Also, the minimum spacing prevents abutting ohmic contacts to adjacent structures thereby further limiting the transistor's minimum size.

The metals used for the multi-layer metal structure causes another problem. Gold typically is used as one metal of the multi-layer structure because gold lowers the structure's contact potential thereby facilitating ohmic contact formation. But, gold reduces the ohmic contact's thermal stability and renders the ohmic contact unsuitable for temperatures exceeding 350 degrees Celsius (350° C.).

Accordingly, it is desirable to have a III–V FET that has ohmic contacts produced by etching instead of lift-off, that provides a gate to ohmic contact spacing of less than one micron, that abuts the ohmic contacts to adjacent structures, and that is devoid of gold.

SUMMERY OF THE INVENTION

Briefly stated, the present invention includes a III–V semiconductor FET having etched ohmic contacts. A gate of the FET is formed in contact with a surface of a III–V substrate. An ohmic contact is created by forming an alloy in contact with the surface of the substrate. The ohmic contact is formed to abut the gate structure by covering a portion of the gate structure and the substrate with the ohmic contact. Then, portions of the ohmic contact are removed from the gate structure by etching. The resulting ohmic contact is substantially devoid of gold.

DETAILED DESCRIPTION OF THE DRAWINGS

Figure 1:
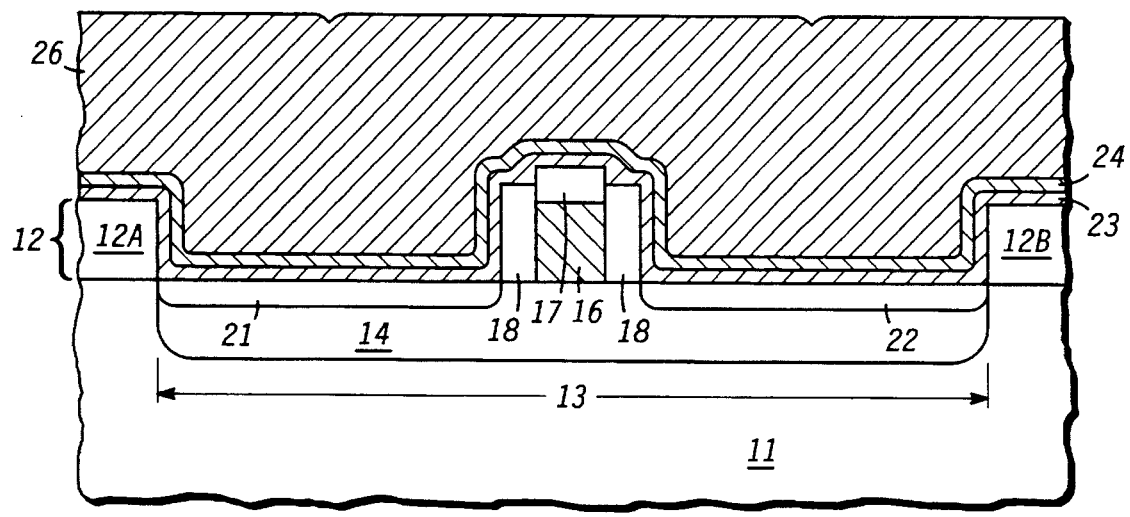
FIG. 1 is an enlarged cross-section illustrating a stage in the formation of a III–V semiconductor FET in accordance with the present invention.

FIG. 1 illustrates an enlarged cross-section of a field effect transistor (FET) 10 having ohmic contacts that are formed by etching. FET 10 includes a gallium arsenide (GaAs) or other III–V compound semiconductor substrate 11 having a first surface with a dielectric layer 12 thereon. An opening having a dimension 13 is formed in dielectric layer 12 in order to expose a portion of the surface of substrate 11. The opening separates dielectric layer 12 into dielectric portions 12A and 12B that function as field oxide regions which isolate FET 10 from other transistors and structures on substrate 11. The exposed portion of substrate 11 is doped through the opening in layer 12 thereby creating a doped region 14 that forms the active layer of FET 10. A gate electrode 16 is formed by depositing gate material onto the exposed surface of substrate 11, then a mask 17 is formed overlying a portion of the gate material that subsequently will form electrode 16, then removing undesired portions of the gate material. Mask 17 remains on electrode 16 and forms a cap that will assist in protecting electrode 16 during subsequent etching operations. Dielectric spacers 18 are then formed to cover the sidewalls of electrode 16. Methods for forming such dielectric spacers are well known to those skilled in the semiconductor art. In the preferred embodiment, mask 17 and spacers 18 are either silicon nitride, silicon dioxide, or both. A preohmic region 21 and a preohmic region 22 are formed by doping the exposed surface of substrate 11 through the opening between dielectric portions 12A and 12B. Consequently, preohmic regions 21 and 22 are self-aligned to dielectric portions 12A and 12B, and to the gate structure that is formed by electrode 16, mask 17, and spacers 18.

A contact layer 23 is deposited to cover dielectric portions 12A and 12B, preohmics 21 and 22, spacers 18, and mask 17. Since portions of contact layer 23 will subsequently be alloyed with preohmics 21 and 22, the material used for contact layer 23 must readily react with the material of substrate 11. Nickel (Ni) and palladium (Pd) are examples of two such materials. Contact layer 23 typically is formed with a thickness of approximately 10 to 50 nanometers. In the preferred embodiment, contact layer 23 is formed by sputtering approximately 20 nanometers of nickel onto FET 10. A thin refractory metal layer 24 is sputtered onto layer 23. A thick planarizing refractory metal layer 26 is applied to cover layer 24 by methods such as chemical vapor deposition (CVD). Since the adhesion of thick planarizing refractory layer 26 is low, sputtered layer 24 forms a base to which layer 26 will readily adhere. Suitable materials for layers 24 and 26 include, but are not limited to, tungsten, titanium, and molybdenum. Layer 24 should have a thickness between approximately 100 and 150 nanometers, while the thickness of layer 26 should be between approximately 700 and 800 nanometers. In the preferred embodiment, layers 24 and 26 have thicknesses of approximately 100 and 750 nanometers respectively.

Figure 2:
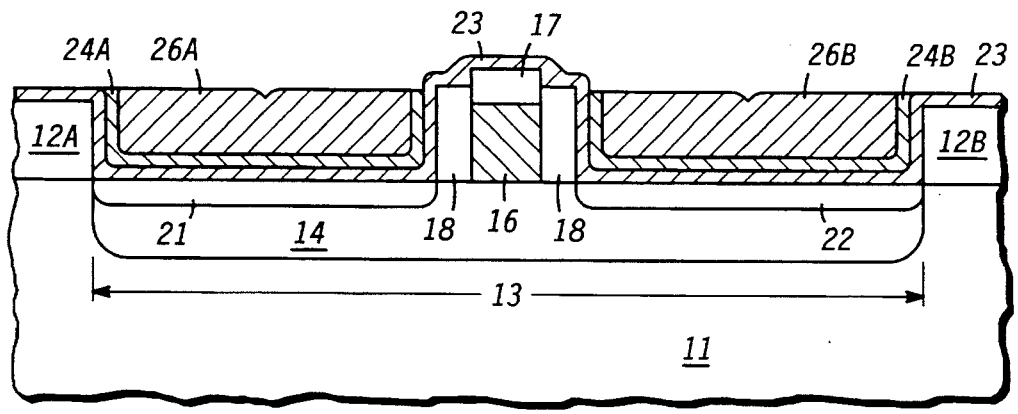
FIG. 2 illustrates a subsequent stage in forming the FET of FIG. 1 in accordance with the present invention.

Referring to FIG. 2, refractory metal layers 24 and 26 of FIG. 1 are etched until contact layer 23, which covers mask 17 and the top of spacers 18, is exposed. The etching is accomplished by refractory metal etching techniques that are well known to those skilled in the semiconductor art. Generally, such refractory metal etching procedures do not etch the material used for contact layer 23, thus, contact layer 23 functions as an etch stop for this operation. Consequently, the portions of contact layer 23 that cover the gate structure and dielectric portions 12A and 12B are now exposed. The portions of refractory metal layers 24 and 26 remaining after the refractory metal etch operation are indicated by refractory metal portions 24A, 24B, 26A and 26B.

Figure 3:
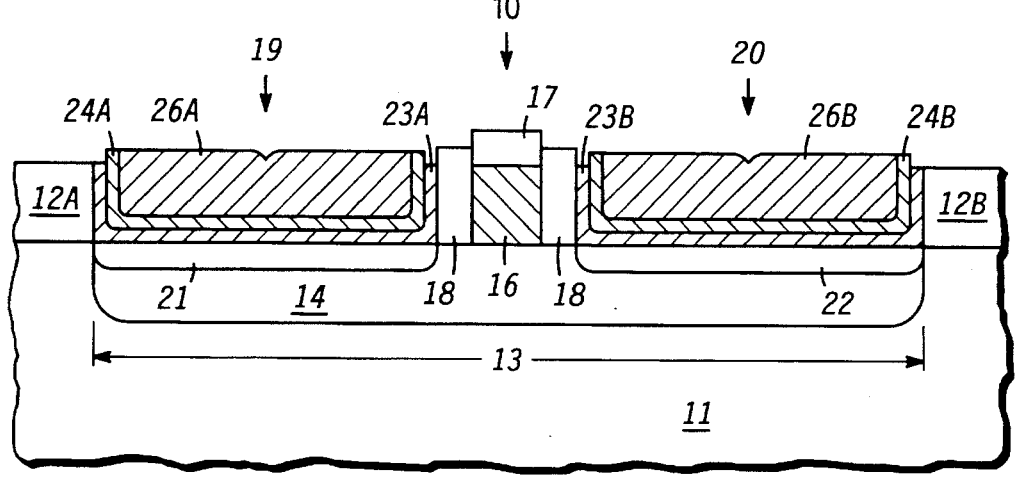
FIG. 3 illustrates the FET of FIG. 2 after forming a gate contact and source and drain ohmic contacts in accordance with the present invention.

Referring to FIG. 3, exposed portions of layer 23 from FIG. 2 are removed by selectively etching with a chemical that removes contact layer 23 without affecting other portions of device 10. For the currently known materials that are suitable for layers 23, 24, and 26, hydrochloric acid (HCl) can be employed for performing such a selective etching operation. Etching time typically is between approximately ten and twenty minutes, and the temperature can be from approximately twenty-five to seventy-five degrees Celsius (25°–75° C.) depending on the thickness of layer 23. In the preferred embodiment, exposed portions of layer 23 are removed by etching with hydrochloric acid (HCl) for about 10 minutes at approximately 40° C. Since the selective etching procedure only etches the material of contact layer 23 (FIG. 2), the portions of contact layer 23 covered by refractory metal portions 24A and 24B are not removed. During the etching of layer 23, spacers 18 and mask 17 protect gate electrode 16. It should be noted that small portions of layer 23 near the edges of refractory metal portions 24A and 24B may be removed as illustrated in FIG. 3.

An ohmic alloying procedure is used to form ohmic contact between preohmic regions 21 and 22 and overlying contact layer portions 23A and 23B, respectively. Portions 24A, 26A, 24B, and 26B are unaffected by the ohmic alloying procedure. Typically, the ohmic alloying procedure includes heating FET 10 to a temperature of approximately 530° C. to 575° C. in an inert atmosphere for a time between thirty-five seconds and five minutes. In the preferred embodiment, a rapid thermal anneal is used to heat FET 10 to approximately 550° C. for approximately one minute. The alloying forms an ohmic contact 19 comprising contact layer portion 23A and refractory metal portions 24A and 26A, and an ohmic contact 20 comprising contact layer portion 23B and refractory metal portions 24B and 26B.

Since contacts 19 and 20 were formed by applying layers 23, 24, and 26 of FIG. 1 around the gate structure and dielectric portions 12A and 12B, contacts 19 and 20 are self-aligned to both the gate structure and to dielectric portions 12A and 12B of FET 10. Because undesired portions of layers 23, 24, and 26 (FIG. 1) were removed by selective etching and not by lift-off techniques, ohmic contacts 19 and 20 abut both the gate structure and dielectric portions 12A and 12B. Consequently, the dimensions of contacts 19 and 20 are only limited by the minimum dimensions that can be produced by lithography equipment. As a result, the dimensions of FET 10 are much smaller than the dimensions produced by lift-off techniques. In the preferred embodiment, contacts 19 and 20 each have a width that is not greater than approximately 0.4 microns, and dimension 13 of FET 10 is not greater than approximately two microns. These dimensions are much smaller than the corresponding seven to eight micron wide FETs produced by lift-off techniques. Further, the etched contacts are stable at temperatures in excess of 350° C. since the contacts are substantially devoid of gold.

Figure 4:
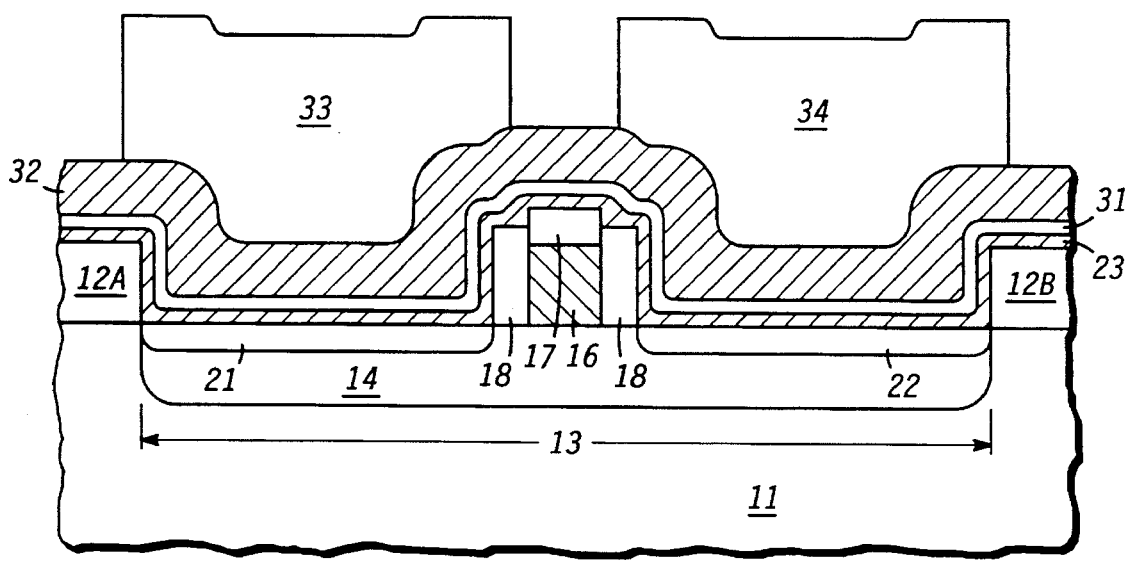
FIG. 4 illustrates a stage in forming an alternate embodiment of a III–V semiconductor FET in accordance with the present invention.

FIG. 4 illustrates an alternate embodiment of a FET 30 having etched ohmic contacts. Portions of FET 30 that are the same as FET 10 of FIG. 1 have the same reference numerals. The method of forming FET 30 departs from the method of forming FET 10 of FIG. 1 subsequent to applying contact layer 23. Contact layer 23 is covered with an optional stability layer 31 which is formed from a material that alloys with layer 23 and creates an alloy with improved high temperature stability characteristics. Suitable materials for layer 31 include silicon and germanium. In order to provide proper material compositions in the alloy, layer 31 generally has a thickness approximately equal to the thickness described for layer 23 in FIG. 1. In the preferred embodiment, layer 31 is approximately 20 nanometers of germanium that is sputtered onto the nickel used for layer 23.

Layer 31 is covered with a refractory metal layer 32 that has sufficient thickness to prevent out-gassing of III–V elements from substrate 11 during subsequent alloying operations. Typically, layer 32 is approximately 100 to 300 nanometers thick. Suitable materials for layer 32 include, but are not limited to, tungsten, titanium, and molybdenum. In the preferred embodiment, layer 32 is created by sputtering approximately 150 nanometers of tungsten onto layer 31. A mask 33 and a mask 34 are formed to overlay preohmics 21 and 22 respectively in order to facilitate subsequent removal of portions of layers 23, 31, and 32. In addition, small portions of adjacent dielectrics 18 and dielectric portions 12A and 12B are also covered to ensure that preohmics 21 and 22 are not exposed by subsequent etching operations.

Figure 5:
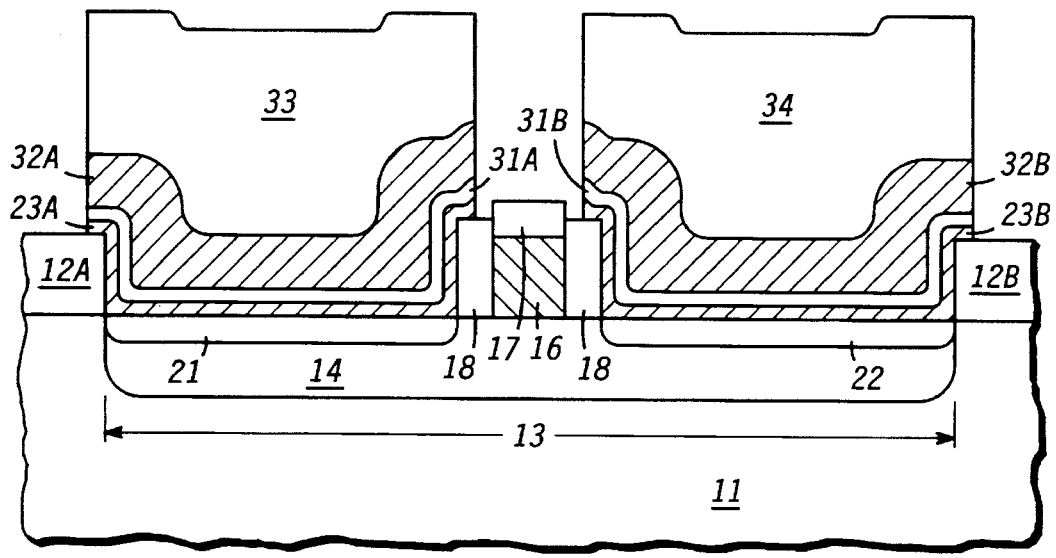
FIG. 5 illustrates a subsequent stage in forming the FET of FIG. 4 in accordance with the present invention.

Referring to FIG. 5, exposed portions of layers 32 and 31 are removed by the methods used for removing layers 24 and 26 in FIG. 1 thereby forming refractory metal caps 32A and 32B. Then, exposed portions of layer 23 are removed as described for the removal of layer 23 in FIG. 2.

Figure 6:
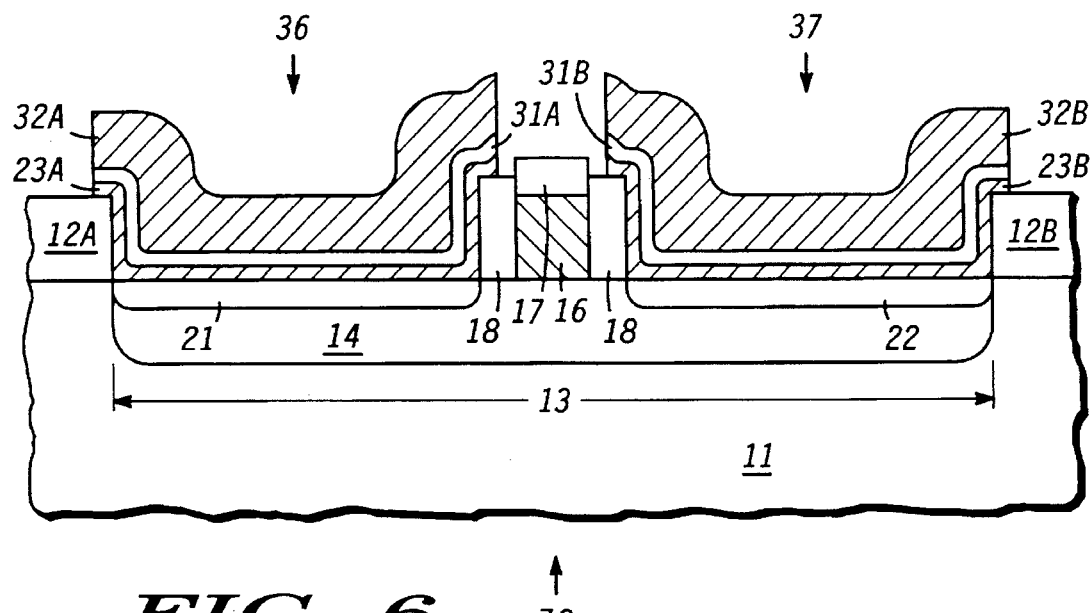
FIG. 6 illustrates the FET of FIG. 5 after forming a gate contact and source and drain ohmic contacts in accordance with the present invention.

Referring to FIG. 6, masks 33 and 34 (FIG. 5) are removed. Ohmic contacts 36 and 37 are formed by performing an ohmic alloying procedure that creates ohmic contact between preohmics 21 and 22, and respective overlying portions of layers 23A and 31A, and 23B and 31B. The ohmic alloying procedure is preformed as described in FIG. 3. Resulting alloys include binary alloys of the materials used for portions 23A, 31A, 23B, and 31B. For example, a nickel-silicon binary alloy results from a nickel portion 23A and a silicon portion 31A while a nickel-germanium alloy results from nickel and germanium used as portions 23A and 31A, respectively. For a palladium portion 23A, palladium-silicon or palladium-germanium binary alloys typically are produced from using silicon or germanium for portion 31A.

This method of forming etched ohmic contacts results in ohmic contacts that are self-aligned to the gate structure and to dielectric portions 12A and 12B. Consequently, FET 30 has a dimension 13 that is not greater than approximately two microns.

Figure 7:
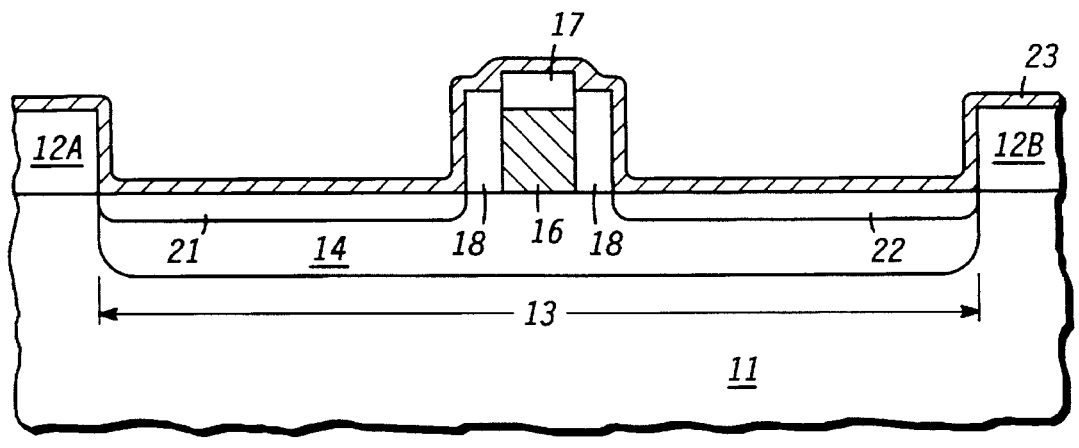
FIG. 7 illustrates a stage in forming another embodiment of a III–V semiconductor FET in accordance with the present invention.

FIG. 7 illustrates a FET 40 that is another embodiment of FET 30 from FIG. 4. Elements of FIG. 7 that are the same as FIG. 4 have the same reference numerals. FET 40 is illustrated in a manufacturing stage subsequent to applying layer 23 in FIG. 4. A first alloying procedure is utilized to form etch resistant and etch susceptible areas in layer 23. The first alloying procedure creates alloys of the material used for preohmics 21 and 22, and the material of overlying portions of layer 23. These alloys form etch resistant areas that are insoluble in some chemicals that dissolve non-alloyed or etch susceptible portions of layer 23. Consequently, the etch susceptible portions of contact layer 23 can be selectively etched by these chemicals. Hydrochloric acid (HCl) is one chemical that is suitable for such a selective etching step. The alloys typically are formed by heating FET 40 to a temperature of approximately 300° C. to 400° C. in an inert atmosphere. The first alloying procedure typically is accomplished below the temperature that will be used for the subsequent formation of ohmic contacts in order to minimize damage to the surface of preohmics 21 and 22. In the preferred embodiment, a rapid thermal anneal procedure is used to heat FET 40 to approximately 400° C. for about one minute.

Since some III–V materials, such as arsenic, have a high vapor pressure, portions of the III–V material may out-diffuse during the first alloying operation and cause pitting at the surface of preohmics 21 and 22. In order to prevent such out-diffusion, the surface of layer 31 may be covered with a silicon nitride ($Si_3N_4$) or silicon dioxide ($SiO_2$) barrier layer.

Figure 8:
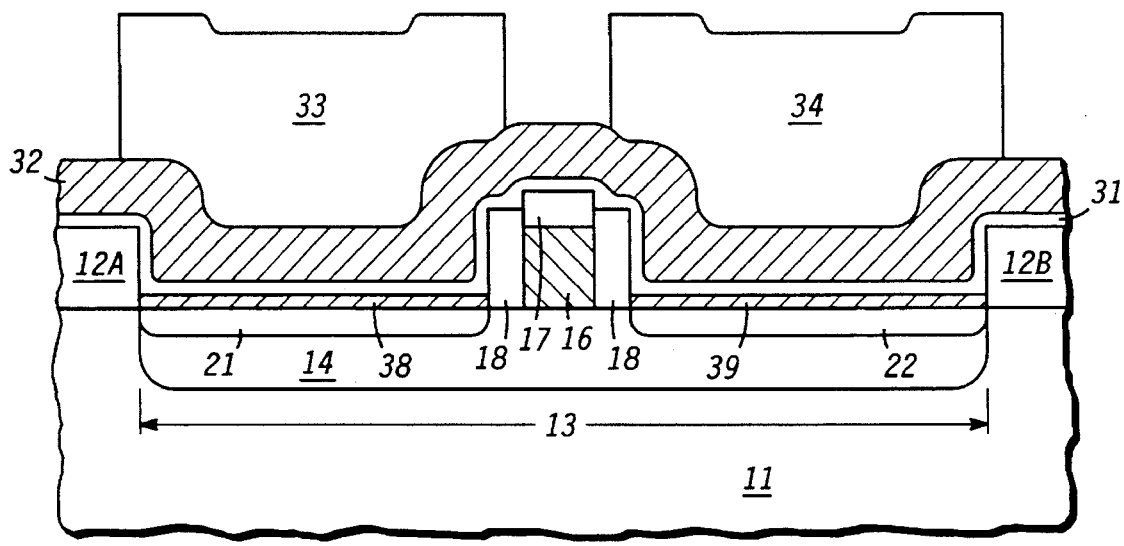
FIG. 8 illustrates a subsequent stage in forming the FET of FIG. 7 in accordance with the present invention.

Referring to FIG. 8, once the etch resistant areas are formed, the etch susceptible portions are removed by selectively etching layer 23 (FIG. 7) with hydrochloric acid (HCl). The time required to perform the selective etching depends upon the thickness of layer 23, and the temperature. Suitable temperatures range from approximately 25° C. to 75° C. while the time may vary from approximately ten to twenty minutes. In the preferred embodiment, the selective etching procedure was performed at a temperature of approximately 40° C. for about ten minutes. This selective etching leaves an etch resistant area or contact alloy 38 and an etch resistant area or contact alloy 39 covering preohmics 21 and 22, respectively. Stability layer 31 and refractory metal layer 32 are then applied, and covered with masks 33 and 34 as described relative to FIG. 4.

Figure 9:
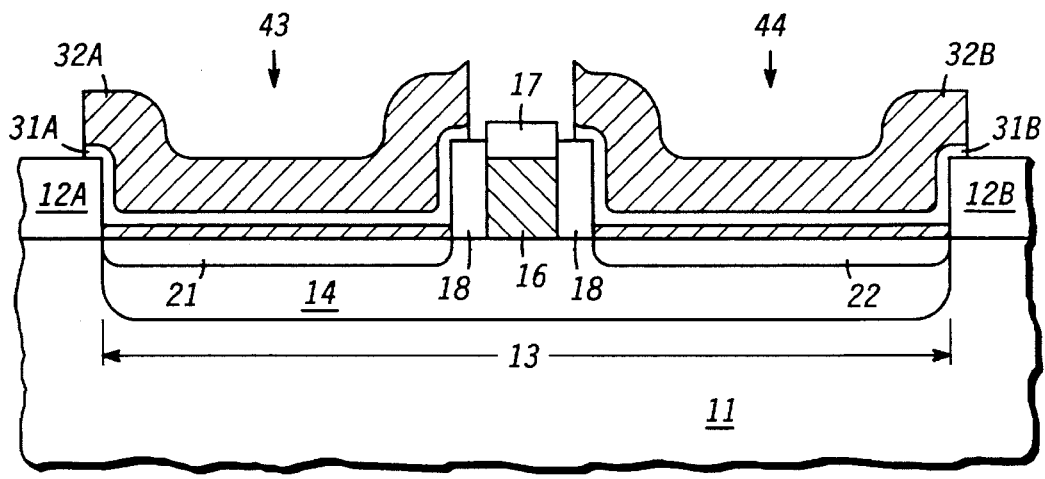
FIG. 9 illustrates the FET of FIG. 8 after forming a gate contact and source and drain ohmic contacts in accordance with the present invention.

Referring to FIG. 9, exposed portions of layers 31 and 32 are removed by the methods used for removing exposed portions of layers 31 and 32 in FIG. 5. Refractory metal caps 32A and 32B, and stability layer portions 31A and 31B result from this operation. Ohmic contacts 43 and 44 are formed by a subsequent ohmic alloying procedure as described in FIG. 6.

Since the non-alloyed or etch susceptible portions of contact layer 23 are removed by selective etching, there is no need for clearance areas between contacts 43 and 44 and adjacent structures, such as dielectric portions 12A and 12B. Consequently, contacts 43 and 44 can abut such adjacent structures and can be formed at the minimum dimensions that can be produced by lithographic equipment. In the preferred embodiment, contacts 43 and 44 each have a width not greater than approximately 0.4 microns, and FET 40 has a dimension 13 that is not greater than two microns. This is a significant advantage over prior art contacts.

By now it should be appreciated that there has been provided a novel way to form a small III–V FET having etched ohmic contacts. Forming the contact layer around the dielectric and gate structures facilitates abutting the contacts to the dielectric and gate structures. Removing undesired portions of the contact layer by etching eliminates the need for clearance areas surrounding the contacts thereby reducing the contact's size. Utilizing etched contacts results in a high yielding and reproducible FET thereby lowering the FET's cost. Since the etched contact is devoid of gold, the FET has a higher thermal stability. The small contact size and the ability to abut adjacent structures facilitates forming a FET having a width of less than two microns thereby further reducing cost and improving performance.

We claim:

1. A self-aligned FET having etched ohmic contacts comprising:

a III–V semiconductor substrate having a surface;

a gate electrode on the surface of the substrate and having a sidewall;

a dielectric spacer abutting the gate electrode and having a vertical face;

a separate cap covering a portion of and aligned with the sidewall of the gate electrode; and an ohmic contact having a contact layer in contact with the surface of the substrate and the vertical face of the dielectric spacer wherein the ohmic contact is substantially devoid of gold and substantially fills a region between a field dielectric layer and the dielectric space, and wherein the ohmic contact is formed to abut the dielectric spacer by covering the cap and the dielectric spacer with the contact layer then removing portions of the contact layer from the cap by etching.

2. The FET of claim 1 further including a field oxide region abutting the ohmic contact, and a refractory metal layer covering the contact layer.

3. The FET of claim 1 wherein the ohmic contact is less than approximately 0.4 microns wide.

4. A self-aligned FET having etched ohmic contacts comprising:

a III–V semiconductor substrate having a surface;

a gate electrode on the surface of the substrate and having a sidewall;

a dielectric spacer abutting the gate electrode and having a vertical face;

a separate cap covering a portion of and aligned with the sidewall of the gate electrode; and an ohmic contact having a contact layer in contact with the surface of the substrate and having a stability layer on the contact layer and on the vertical face of the dielectric spacer wherein the ohmic contact is substantially devoid of gold and substantially fills a region between a field dielectric layer and the dielectric spacer, and wherein the ohmic contact is formed to abut the dielectric spacer by covering the cap and the dielectric spacer with the stability layer then removing portions of the stability layer from the cap by etching.

5. The FET of claim 4 wherein said stability layer comprises at least one member of the group consisting of silicon and germanium.

* * * * *

UNITED STATES PATENT AND TRADEMARK OFFICE
CERTIFICATE OF CORRECTION

PATENT NO. : 5,583,355

DATED : December 10, 1996

INVENTOR(S) : Bruce Bernhardt     Jaeshin Cho
                Gregory L. Hansell    Schyi-yi Wu It is certified that error appears in the above-indentified patent and that said Letters Patent is hereby corrected as shown below:

Claim 1, column 6, line 33
Delete "space" and insert --spacer--.

Signed and Sealed this

Twenty-fourth Day of June, 1997

*Attest:*

BRUCE LEHMAN

*Attesting Officer*      Commissioner of Patents and Trademarks